(12) United States Patent
Kim

(10) Patent No.: US 10,770,675 B2
(45) Date of Patent: Sep. 8, 2020

(54) ORGANIC LIGHT-EMITTING DISPLAY DEVICE HAVING AN ENCAPSULATING SUBSTRATE OF HIGH THERMAL CONDUCTIVITY

(71) Applicant: LG Display Co., Ltd., Seoul (KR)

(72) Inventor: Tae-Ho Kim, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/133,307

(22) Filed: Sep. 17, 2018

(65) Prior Publication Data

US 2019/0103583 A1 Apr. 4, 2019

(30) Foreign Application Priority Data

Sep. 29, 2017 (KR) .................. 10-2017-0127391

(51) Int. Cl.
| | |
|---|---|
| H01L 27/32 | (2006.01) |
| H01L 51/52 | (2006.01) |
| H01L 51/50 | (2006.01) |
| H01L 27/12 | (2006.01) |

(52) U.S. Cl.
CPC ........ *H01L 51/5237* (2013.01); *H01L 27/322* (2013.01); *H01L 27/3246* (2013.01); *H01L 51/5012* (2013.01); *H01L 51/5206* (2013.01); *H01L 51/529* (2013.01); *H01L 51/5221* (2013.01); *H01L 51/5259* (2013.01); *H01L 27/1225* (2013.01)

(58) Field of Classification Search
CPC ............... H01L 51/5237; H01L 27/322; H01L 27/3246
See application file for complete search history.

(56) References Cited

U.S. PATENT DOCUMENTS

| | | | |
|---|---|---|---|
| 2006/0290271 A1 | 12/2006 | Cok | |
| 2008/0001864 A1 | 1/2008 | Lee et al. | |
| 2016/0062520 A1* | 3/2016 | Choi | ............. G09G 5/003 345/174 |
| 2016/0133877 A1 | 5/2016 | Matsumoto et al. | |
| 2016/0254485 A1 | 9/2016 | Song | |
| 2017/0040570 A1 | 2/2017 | Kim et al. | |
| 2017/0194596 A1* | 7/2017 | Shen | .............. H01L 51/5237 |

FOREIGN PATENT DOCUMENTS

| | | |
|---|---|---|
| CN | 101057329 A | 10/2007 |
| CN | 101652870 A | 2/2010 |
| CN | 102771188 A | 11/2012 |

(Continued)

*Primary Examiner* — Trang Q Tran
(74) *Attorney, Agent, or Firm* — Seed IP Law Group LLP

(57) ABSTRACT

An organic light-emitting display device including an encapsulating layer and an encapsulating substrate disposed on the encapsulating layer is provided. The encapsulating layer may cover a light-emitting element. The encapsulating substrate may include a material having high thermal conductivity. A reinforcing member may overlap the light-emitting element between the encapsulating layer and the encapsulating substrate. Thus, in the organic light-emitting display device, the rigidity of the encapsulating substrate may be complemented by the reinforcing member. Thereby, the organic light-emitting display device may prevent damage of the light-emitting element due to external impact.

22 Claims, 3 Drawing Sheets

(56) References Cited

FOREIGN PATENT DOCUMENTS

| | | |
|---|---|---|
| CN | 103081157 A | 5/2013 |
| CN | 104183785 A | 12/2014 |
| CN | 203983342 U | 12/2014 |
| CN | 104701353 A | 6/2015 |
| CN | 105390526 A | 3/2016 |
| CN | 106463648 A | 2/2017 |
| KR | 10-2017-0051600 A | 5/2017 |

* cited by examiner

ORGANIC LIGHT-EMITTING DISPLAY DEVICE HAVING AN ENCAPSULATING SUBSTRATE OF HIGH THERMAL CONDUCTIVITY

This application claims the priority benefit of Korean Patent Application No. 10-2017-0127391, filed on Sep. 29, 2017, which is hereby incorporated by reference as if fully set forth herein.

BACKGROUND

Technical Field

The present disclosure relates to an organic light-emitting display device including an encapsulating substrate having a high thermal conductivity to rapidly emit heat generated in a light-emitting element and/or a driving circuit to the outside.

Description of the Related Art

Generally, an electronic appliance, such as a monitor, a TV, a laptop computer and a digital camera, include a display device to realize an image. For example, the display device may include a liquid crystal display device and/or an organic light-emitting display device.

The organic light-emitting display device may include a light-emitting element. The light-emitting element may generate light realizing a specific color. For example, the light-emitting element may include a first electrode, a light-emitting layer and a second electrode, which are sequentially stacked.

The organic light-emitting display device may prevent external moisture from permeating to the light-emitting element. For example, the organic light-emitting display device may include an encapsulating layer covering the light-emitting element, and an encapsulating substrate disposed on the encapsulating layer.

The light-emitting element and a driving circuit controlling the light-emitting element may generate heat during an operation of realizing an image. The light-emitting layer may be very vulnerable to heat. Thus, the organic light-emitting display device must rapidly emit heat generated in the light-emitting element and/or the driving circuit to the outside. For example, the organic light-emitting display device may include the encapsulating substrate formed of a material having a relatively high thermal conductivity, such as aluminum (Al).

However, since the material having a high thermal conductivity may have a relatively low rigidity, the light-emitting element of the organic light-emitting display device may be damaged by an external impact. In order to prevent damage of the light-emitting element due to the external impact, the organic light-emitting display device may increase a thickness of the encapsulating substrate or add additional layer for reinforcing rigidity on the encapsulating substrate, but the overall thickness of the organic light-emitting display device may be increased.

BRIEF SUMMARY

Accordingly, the present disclosure is directed to an organic light-emitting display device that substantially reduces one or more problems due to limitations and disadvantages of the related art.

An object of the present disclosure is to provide an organic light-emitting display device capable of having high heat radiation efficiency, and preventing damage of a light-emitting element due to external impact.

Another object of the present disclosure is to provide an organic light-emitting display device capable of complementing the rigidity of an encapsulating substrate without increasing the overall thickness.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, there is provided an organic light-emitting display device including a device substrate. The device substrate includes a display area and a non-display area. The non-display area is disposed outside the display area. A light-emitting element is disposed on the display area of the device substrate. An encapsulating layer is disposed on the light-emitting element. The encapsulating layer is extended on the non-display area of the device substrate. An encapsulating substrate is disposed on the encapsulating layer. A first reinforcing member is disposed between the encapsulating layer and the encapsulating substrate. The first reinforcing member overlaps with the display area of the device substrate.

The encapsulating layer may cover a side surface of the first reinforcing member.

A second reinforcing member may be disposed between the encapsulating layer and the encapsulating substrate. The second reinforcing member may overlap with the non-display area of the device substrate. The second reinforcing member may be spaced away from the first reinforcing member.

A side surface of the second reinforcing member may be covered by the encapsulating layer.

The second reinforcing member may include a plurality of patterns being spaced away from each other.

The first reinforcing member may include a material same as the encapsulating layer. The first reinforcing member may be harder than the encapsulating layer.

The first reinforcing member may include moisture-absorbing beads.

The encapsulating layer may include moisture-absorbing particles. The density of the moisture-absorbing beads in the first reinforcing member may be lower than the density of the moisture-absorbing particles in the encapsulating layer.

In another embodiment, the organic light-emitting display device comprises an encapsulating substrate on a device substrate. A light-emitting element is disposed on an upper surface of the device substrate facing the encapsulating substrate. A reinforcing member is disposed on a lower surface of the encapsulating substrate facing the device substrate. An encapsulating layer is disposed between the device substrate and the encapsulating substrate. The encapsulating layer surrounds the light-emitting element and the reinforcing member. The reinforcing member includes metal beads in one embodiment.

The metal beads may include a magnetic material.

The reinforcing member may further include elastic beads.

The elastic beads may include rubber.

The encapsulating substrate may include aluminum.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
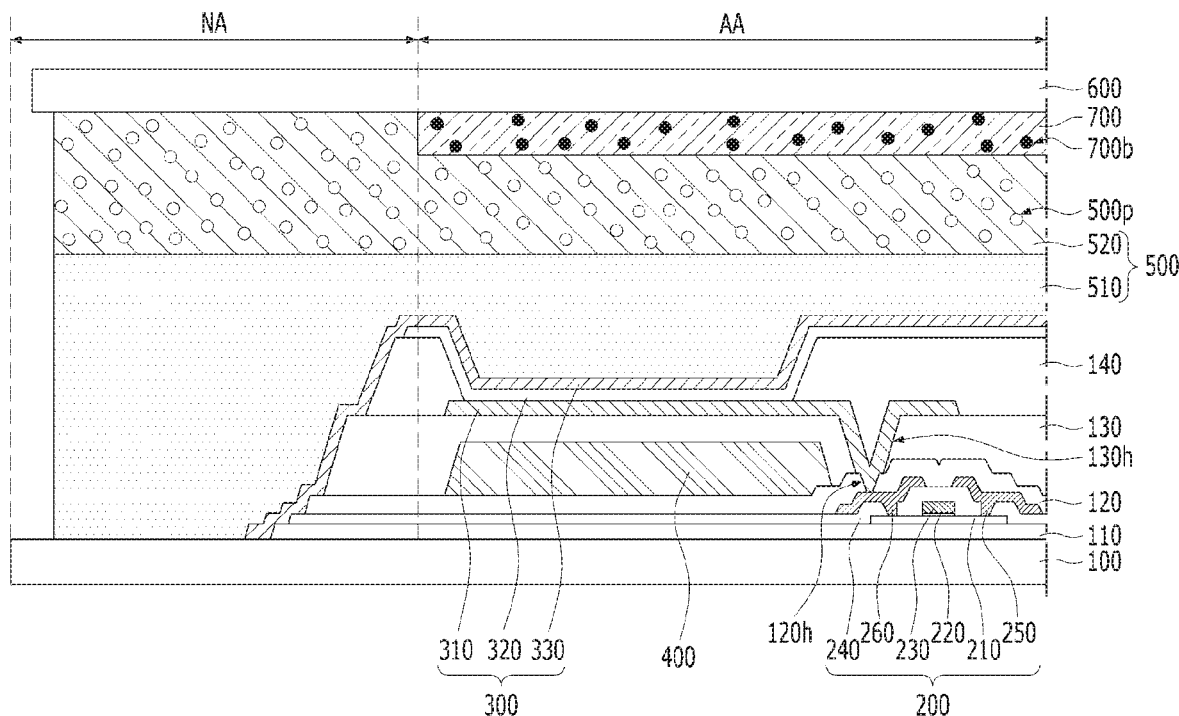
FIG. 1 is a view schematically showing an organic light-emitting display device according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification, and in the drawings, the lengths and thickness of layers and regions may be exaggerated to more easily illustrate various features of the disclosure to those of skill in the art. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

FIG. 1 is a view showing an organic light-emitting display device according to an embodiment of the present disclosure.

Referring to FIG. 1, the organic light-emitting display device according to the embodiment of the present disclosure may include a device substrate 100. The device substrate 100 may include an insulating material. The device substrate 100 may include a transparent material. For example, the device substrate 100 may include glass or plastic.

The device substrate 100 may include a display area AA and a non-display area NA. The non-display area NA may be disposed outside the display area AA. For example, the non-display area NA may include an edge of the device substrate 100.

A thin film transistor 200 may be disposed on the display area AA of the device substrate 100. For example, the thin film transistor 200 may include a semiconductor pattern 210, a gate insulating layer 220, a gate electrode 230, an interlayer insulating layer 240, a source electrode 250 and a drain electrode 260.

The semiconductor pattern 210 may be disposed close to the device substrate 100. The semiconductor pattern 210 may include a semiconductor material. For example, the semiconductor pattern 210 may include amorphous silicon or poly-silicon. The semiconductor pattern 210 may be an oxide semiconductor. For example, the semiconductor pattern 210 may include IGZO.

The semiconductor pattern 210 may include a source region, a drain region and a channel region. The channel region may be disposed between the source region and the drain region. The conductivity of the channel region may be lower than the conductivities of the source region and the drain region. For example, the source region and the drain region may include a conductive impurity.

The gate insulating layer 220 may be disposed on the semiconductor pattern 210. A size of the gate insulating layer 220 may be smaller than a size of the semiconductor pattern 210. For example, the gate insulating layer 220 may overlap with the channel region of the semiconductor pattern 210.

The gate insulating layer 220 may include an insulating material. For example, the gate insulating layer 220 may include silicon oxide and/or silicon nitride. The gate insulating layer 220 may include a high-K material. For example, the gate insulating layer 220 may include hafnium oxide (HfO) or titanium oxide (TiO). The gate insulating layer 220 may have a multi-layer structure.

The gate electrode 230 may be disposed on the gate insulating layer 220. For example, the gate electrode 230 may overlap the channel region of the semiconductor pattern 210. The gate electrode 230 may be insulated from the semiconductor pattern 210 by the gate insulating layer 220. For example, a side surface of the gate electrode 230 may be vertically aligned with a side surface of the gate insulating layer 220.

The gate electrode 230 may include a conductive material. For example, the gate electrode 230 may include a metal, such as aluminum (Al), chrome (Cr), molybdenum (Mo) and tungsten (W).

The interlayer insulating layer 240 may be disposed on the semiconductor pattern 210 and the gate electrode 230. The interlayer insulating layer 240 may be extended beyond the semiconductor pattern 210. For example, a side surface of the semiconductor pattern 210 may be covered by the interlayer insulating layer 240.

The interlayer insulating layer 240 may include an insulating material. For example, the interlayer insulating layer 240 may include silicon oxide.

The source electrode 250 may be disposed on the interlayer insulating layer 240. The source electrode 250 may be electrically connected to the source region of the semiconductor pattern 210. For example, the source electrode 250 may overlap the source region of the semiconductor pattern 210. The interlayer insulating layer 240 may include a contact hole partially exposing the source region of the semiconductor pattern 210.

The source electrode 250 may include a conductive material. For example, the source electrode 250 may include a metal, such as aluminum (Al), chrome (Cr), molybdenum (Mo) and tungsten (W). The source electrode 250 may include a material different from the gate electrode 230.

The drain electrode 260 may be disposed on the interlayer insulating layer 240. The drain electrode 260 may be electrically connected to the drain region of the semiconductor pattern 210. The drain electrode 260 may be spaced away from the source electrode 250. For example, the drain electrode 260 may overlap the drain region of the semiconductor pattern 210. The interlayer insulating layer 240 may further include a contact hole partially exposing the drain region of the semiconductor pattern 210.

The drain electrode 260 may include a conductive material. For example, the drain electrode 260 may include a metal, such as aluminum (Al), chrome (Cr), molybdenum (Mo) and tungsten (W). The drain electrode 260 may include a material different from the gate electrode 230. The drain electrode 260 may include a material same as the source electrode 250.

A buffer layer 110 may be disposed between the device substrate 100 and the thin film transistor 200. For example, the buffer layer 110 may be disposed between the device substrate 100 and the semiconductor pattern 210. The buffer layer 110 may include an insulating material. For example, the buffer layer 110 may include silicon oxide.

A lower passivation layer 120 may be disposed on the thin film transistor 200. The lower passivation layer 120 may prevent damage of the thin film transistor 200 due to external impact and moisture. For example, the lower passivation layer 120 may be extended beyond the source electrode 250 and the drain electrode 260. The lower passivation layer 120 may be in direct contact with the interlayer insulating layer 240 at the outside of the source electrode 250 and the drain electrode 260. The lower passivation layer 120 may include an insulating material. The lower passivation layer 120 may include a material different from the interlayer insulating layer 240. For example, the lower passivation layer 120 may include silicon nitride.

An over-coat layer 130 may be disposed on the lower passivation layer 120. The over-coat layer 130 may remove a thickness difference due to the thin film transistor 200. For example, an upper surface of the over-coat layer 130 opposite to the device substrate 100 may be a flat surface.

The over-coat layer 130 may include an insulating material. The over-coat layer 130 may include a material different from the lower passivation layer 120. The over-coat layer 130 may include a material having a relative high fluidity. For example, the over-coat layer 130 may include an organic insulating material.

A light-emitting element 300 may be disposed on the over-coat layer 130. The light-emitting element 300 may generate light realizing a specific color. For example, the light-emitting element 300 may include a first electrode 310, a light-emitting layer 320 and a second electrode 330, which are sequentially stacked.

The first electrode 310 may be disposed close to the over-coat layer 130. The light-emitting element 300 may be controlled by the thin film transistor 200. For example, the first electrode 310 may be electrically connected to the drain electrode 260 of the thin film transistor 200. For example, the lower passivation layer 120 may include a lower contact hole 120h exposing at least a portion of the drain electrode 260. The over-coat layer 130 may include an upper contact hole 130h overlapping with the lower contact hole 120h. The first electrode 310 may be extended along a side wall of the lower contact hole 120h and a side wall of the upper contact hole 130h.

The first electrode 310 may include a conductive material. The first electrode 310 may include a transparent material. For example, the first electrode 310 may be a transparent electrode formed of a transparent material, such as ITO and IZO.

The light-emitting layer 320 may generate light having luminance corresponding to a voltage difference between the first electrode 310 and the second electrode 330. For example, the light-emitting layer 320 may include an emitting material layer (EML) having an emission material. The emission material may be an organic material.

The light-emitting layer 320 may have a multi-layer structure in order to increase luminous efficiency. For example, the light-emitting layer 320 may further include at least one of a hole injection layer (HIL), a hole transporting layer (HTL), an electron transporting layer (ETL) and an electron injection layer (EIL).

The second electrode 330 may include a conductive material. The second electrode 330 may include a material different from the first electrode 310. For example, the second electrode 330 may include a metal having a high reflectance, such as aluminum (Al). Thus, in the organic light-emitting display device according to the embodiment of the present disclosure, the light generated by the light-emitting layer 320 may be emitted to the outside through the device substrate 100.

In the organic light-emitting display device according to the embodiment of the present disclosure, a plurality of light-emitting elements 300 may be disposed on the device substrate 100. Each of the light-emitting elements 300 may be driven, independently. For example, the first electrode 310 of each light-emitting element 300 may be separated from the first electrodes 310 of adjacent light-emitting elements 300. A bank insulating layer 140 may be disposed between the first electrodes 310 of adjacent light-emitting elements 300. The bank insulating layer 140 may cover an edge of the first electrode 310. The light-emitting layer 320 and the second electrode 330 may be stacked on a portion of the first electrode 310 exposed by the bank insulating layer 140.

The bank insulating layer 140 may include an insulating material. For example, the bank insulating layer 140 may include an organic insulating material. The bank insulating layer 140 may a material different from the over-coat layer 130.

The portion of the first electrode 310 exposed by the bank insulating layer 140 may be spaced away from the thin film transistor 200. For example, the bank insulating layer 140 may overlap the thin film transistor 200. Thus, in the organic light-emitting display device according to the embodiment of the present disclosure, the light traveling toward the device substrate 100 from the light-emitting element 300 may not be blocked by the thin film transistor 200.

The second electrode 330 may be extended on the bank insulating layer 140. For example, the second electrode 330 may be extended on a side surface of the bank insulating layer 140, a side surface of the over-coat layer 130, and a side surface of the lower passivation layer 120, which are disposed close to the non-display area NA of the device substrate 100. Thus, the organic light-emitting display device according to the embodiment of the present disclosure may prevent the permeation of external moisture through insulating layers stacked between the device substrate 100 and the second electrode 330, or a boundary between adjacent the insulating layers.

A color filter 400 may be disposed between the device substrate 100 and the light-emitting element 300. For example, the color filter 400 may be disposed between the lower passivation layer 120 and the over-coat layer 130. A thickness difference due to the color filter 400 may be removed by the over-coat layer 130. The color filter 400 may change a color realized by the light which is emitted from the light-emitting element 300.

For example, the light-emitting layer 320 may generate light realizing white color, and the color filter 400 may realize blue color, red color or green color using the light generated by the light-emitting layer 320. The color filter 400 may have a horizontal width larger than the portion of the first electrode 310 which is exposed by the bank insulating layer 140. Thus, in the organic light-emitting display device according to the embodiment of the present disclosure, light leakage may be prevented.

An encapsulating layer 500 may be disposed on the light-emitting element 300. The encapsulating layer 500 may prevent damage of the light-emitting element 300 due to the external impact and moisture. The encapsulating layer 500 may be extended on the non-display area NA of the device substrate 100. For example, the light-emitting element 300 may be covered by the encapsulating layer 500, completely.

The encapsulating layer 500 may have a multi-layer structure. For example, the encapsulating layer 500 may include a lower encapsulating layer 510 and an upper encapsulating layer 520 disposed on the lower encapsulating layer 510. The light-emitting element 300 may be covered by the lower encapsulating layer 510. The upper encapsulating layer 520 may include moisture-absorbing particles 500p. The moisture-absorbing particles 500p may include a moisture-absorbing material. Thus, in the organic light-emitting display device according to the embodiment of the present disclosure, the stress applied to the light-emitting element 300 due to the expansion of the moisture-absorbing particles 500p may be relieved by the lower encapsulating layer 510.

The lower encapsulating layer 510 and the upper encapsulating layer 520 may include an insulating material. The lower encapsulating layer 510 and the upper encapsulating layer 520 may include an adhesive material. The lower encapsulating layer 510 and the upper encapsulating layer 520 may include a material which does not require a curing process. For example, the lower encapsulating layer 510 and the upper encapsulating layer 520 may include an olefin-based material. Thus, in the organic light-emitting display device according to the embodiment of the present disclosure, the degradation of the light-emitting layer 320 may be prevented by forming the lower encapsulating layer 510 and the upper encapsulating layer 520. The upper encapsulating layer 520 may include a material different from the lower encapsulating layer 510. Therefore, in the organic light-emitting display device according to the embodiment of the present disclosure, the relief of the stress by the lower encapsulating layer 510 may be performed, efficiently.

In one example, the lower encapsulating layer 510 is an organic planarizing layer of a type known in the art. It can also be an inorganic planarizing layer, such as a phosphosilicate glass, a borophosphosilicate glass or the like.

The organic light-emitting display device according to the embodiment of the present disclosure is described that the encapsulating layer 500 is in direct contact with the light-emitting element 300. However, the organic light-emitting display device according to another embodiment of the present disclosure may further include an upper passivation layer (not shown) disposed between the light-emitting element 300 and the lower encapsulating layer 510. The upper passivation layer may prevent damage of the light-emitting element 300 due to the external impact and moisture. The upper passivation layer may include an insulating material. The upper passivation layer may have a multi-layer structure. For example, the upper passivation layer may have a structure in which an organic layer formed of an organic insulating material is disposed between inorganic layers formed of an inorganic insulating material.

An encapsulating substrate 600 may be disposed on the encapsulating layer 500. The encapsulating substrate 600 may include a region being in direct contact with the encapsulating layer 500. Thus, the encapsulating substrate 600 may be coupled to the device substrate 100 on which the thin film transistor 200 and the light-emitting element 300 are formed, by the encapsulating layer 500.

The encapsulating substrate 600 may overlap with the display area AA and the non-display area NA of the device substrate 100. A size, either area or volume or both of the encapsulating substrate 600 may be larger than a size of the encapsulating layer 500. For example, a lower surface of the encapsulating substrate 600 may have a larger area than the area of the encapsulating layer 500 and include an edge exposed by the encapsulating layer 500. Thus, in the organic light-emitting display device according to the embodiment of the present disclosure, the defect due to misalignment of the upper encapsulating layer 520 may be prevented. The size of the encapsulating substrate 600 may be smaller than a size of the device substrate 100. For example, a side surface of the encapsulating substrate 600 may be disposed between a side surface of the device substrate 100 and a side surface of the encapsulating layer 500, which embodiment is shown in FIG. 1. The encapsulating substrate 600 will have a thickness less than the thickness of the encapsulating layer 500 in one preferred embodiment, but in other embodiments, the thickness of the encapsulating substrate 600 may be equal to or greater than the encapsulating layer 500.

The encapsulating substrate 600 may include a material different from the device substrate 100. The encapsulating substrate 600 may provide the radiation path of heat generated in the light-emitting element 300 and/or the thin film transistor 200 during an operation of realizing an image. For example, the encapsulating substrate 600 may include a metal having a relatively high thermal conductivity, such as aluminum (Al).

A reinforcing member 700 may be disposed between the encapsulating layer 500 and the encapsulating substrate 600. For example, the reinforcing member 700 may be disposed on a lower surface of the encapsulating substrate 600 facing the device substrate 100. The reinforcing member 700 may overlap the display area AA of the device substrate 100. For example, the light-emitting element 300 may overlap with a portion of the reinforcing member 700.

The reinforcing member 700 may include an insulating material. For example, the reinforcing member 700 may include an olefin-based material. The rigidity of the reinforcing member 700 may be larger than the rigidity of the encapsulating layer 500.

In some embodiments, the reinforcing member 700 is a bead holding encapsulation layer. Therefore, member 700 can be referred to as a reinforcing member or a bead holding encapsulation layer, depending on the embodiment.

For example, the reinforcing member 700 may include metal beads 700b. Thus, in the organic light-emitting display device according to the embodiment of the present disclosure, the rigidity of the encapsulating substrate 600 may be complemented without increasing the overall thickness. Therefore, in the organic light-emitting display device according to the embodiment of the present disclosure, damage of the light-emitting element 300 due to the external impact may be prevented.

The metal beads 700b may include a magnetic material. For example, the metal beads 700b may include a ferromagnetic metal, such as iron (Fe), nickel (Ni) and cobalt (Co). In one embodiment, the metal beads 700b are ferrous metals not yet magnetized and have no magnetic field. In another embodiment, the metal beads 700b are magnetized prior to being inserted into the layer and thus have a magnetic field while encapsulated. Thus, in the organic light-emitting display device according to the embodiment of the present disclosure, the encapsulating substrate 600 may be moved by a jig having a magnetic plate. That is, in the organic light-emitting display device according to the embodiment of the present disclosure, the location of the encapsulating substrate 600 may be easily adjusted during a process of coupling the encapsulating substrate 600 and the device substrate 100. And, in the organic light-emitting display device according to the embodiment of the present disclosure, a transfer jig of the encapsulating substrate 600 may be simplified, so that damage of the encapsulating substrate 600 and/or the device substrate 100 may be prevented during a process of attaching or detaching the encapsulating substrate 600 to the transfer jig. Also, in the organic light-emitting display device according to the embodiment of the present disclosure, a process of attaching or detaching the encapsulating substrate 600 by the transfer jig may be simplified, so that a process time required for coupling the device substrate 100 and the encapsulating substrate 600 may be reduced. Thereby, in the organic light-emitting display device according to the embodiment of the present disclosure, damage of the light-emitting element 300 due to the external impact may be prevented, and process efficiency may be improved.

A side surface of the reinforcing member 700 may be covered by the encapsulating layer 500. For example, the upper encapsulating layer 520 may cover the side surface of the reinforcing member 700. The upper encapsulating layer 520 may be in direct contact with a portion of the encapsulating substrate 600 which overlaps the non-display area NA of the device substrate 100. Thus, in the organic light-emitting display device according to the embodiment of the present disclosure, the permeation of the external moisture through the reinforcing member 700 may be prevented. Therefore, in the organic light-emitting display device according to the embodiment of the present disclosure, the reliability may be increased.

Accordingly, in the organic light-emitting display device according to the embodiment of the present disclosure, the encapsulating substrate 600 disposed on the encapsulating layer 500 which cover the light-emitting element 300 may include a material having a high thermal conductivity, such as aluminum (Al), and the reinforcing member 700 harder than the encapsulating layer 500 may overlap the light-emitting element 300 between the encapsulating layer 500 and the encapsulating substrate 600, so that the rigidity of the encapsulating substrate 600 may be complemented enough to prevent damage of the light-emitting element 300 due to the external impact. Thus, in the organic light-emitting display device according to the embodiment of the present disclosure, the heat radiation efficiency by the encapsulating substrate 600 may be increased, and the damage of the light-emitting element 300 due to the external impact may be prevented by the reinforcing member 700. Also, in the organic light-emitting display device according to the embodiment of the present disclosure, the metal beads 700b including a magnetic material may be dispersed in the reinforcing member 700, so that the process efficiency may be increased. Therefore, in the organic light-emitting display device according to the embodiment of the present disclosure, the heat radiation efficiency, the process efficiency and the reliability may be improved.

The organic light-emitting display device according to one embodiment of the present disclosure is described that only metal beads 700b are disposed in the reinforcing member 700.

Figure 2:
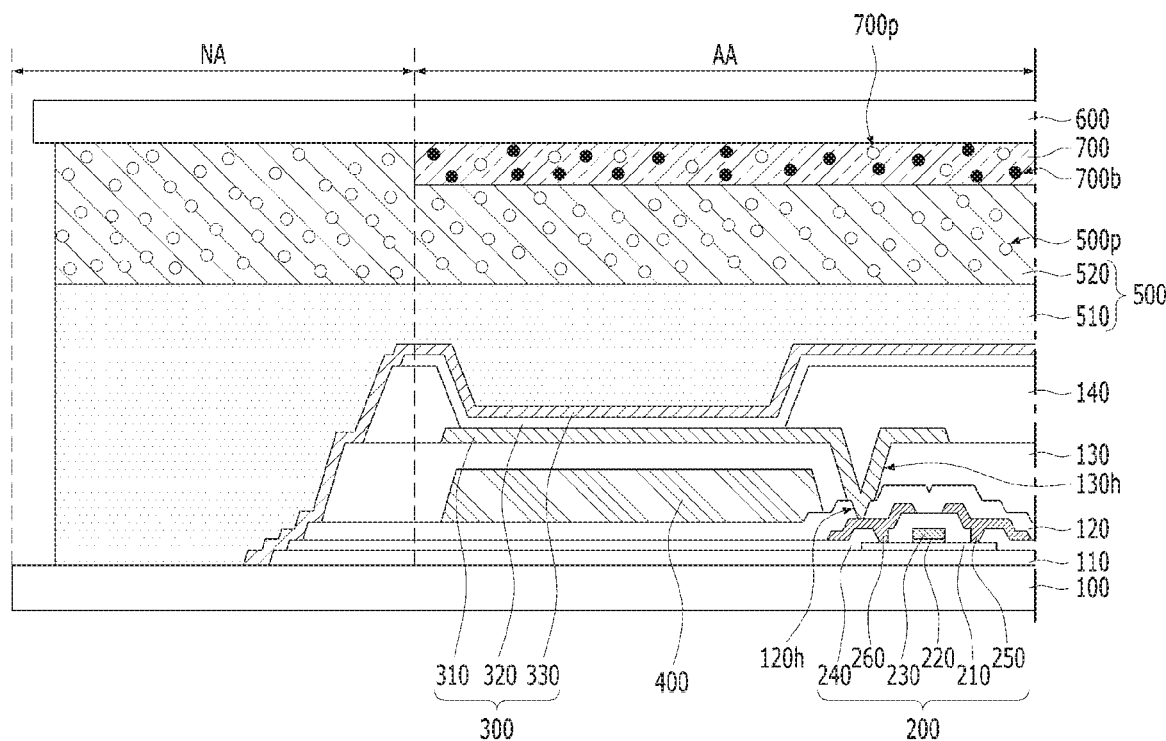
FIGS. 2 to 5 are views respectively showing the organic light-emitting display device according to various alternative embodiments of the present disclosure.

In the organic light-emitting display device according to another embodiment of the present disclosure, the reinforcing member 700 may include a combination of the metal beads 700b and moisture-absorbing beads 700p, as shown in FIG. 2. The moisture-absorbing beads 700p may include a moisture-absorbing material. For example, the moisture-absorbing beads 700p may include a material same as the moisture-absorbing particles 500p. Thus, in the organic light-emitting display device according to another embodiment of the present disclosure, the permeation of the external moisture through the reinforcing member 700 may be blocked, efficiently. The density of the moisture-absorbing beads 700p may be smaller than the density of the moisture absorbing particles 500p. Therefore, in the organic light-emitting display device according to another embodiment of the present disclosure, damage of the encapsulating substrate 600 due to the stress applied by the expansion of the moisture-absorbing beads 700p may be prevented. Thereby, in the organic light-emitting display device according to another embodiment of the present disclosure, the heat radiation efficiency and the reliability may be increased, efficiently.

The organic light-emitting display device according to one embodiment of the present disclosure is described that the reinforcing member 700 is harder than the encapsulating layer 500. However, in the organic light-emitting display device according to another embodiment of the present disclosure, the reinforcing member 700 may have elasticity.

Figure 3:
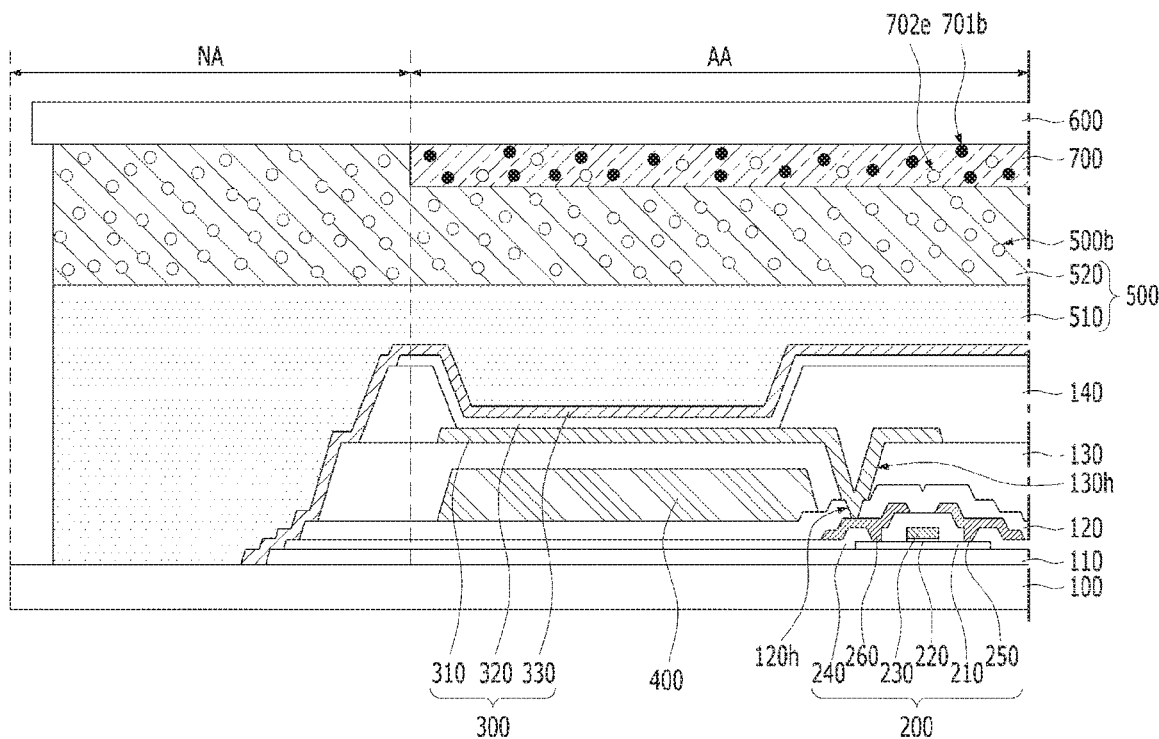

In the organic light-emitting display device according to another embodiment of the present disclosure, the reinforcing member 700 may include metal beads 701b and elastic beads 702e, as shown in FIG. 3. The elastic beads 702e may include an elastic material. For example, the elastic beads 702e may include rubber or a polymer material. Thus, in the organic light-emitting display device according to another embodiment of the present disclosure, the external impact applied to the encapsulating substrate 600 may be relieved by the reinforcing member 700. Therefore, in the organic light-emitting display device according to another embodiment of the present disclosure, the rigidity of the encapsulating substrate 600 having a high heat radiation may be complemented.

The organic light-emitting display device according to one embodiment of the present disclosure is described that the side surface of the reinforcing member 700 coincides with a boundary between the display area AA and the non-display area NA of the device substrate 100.

Figure 4:
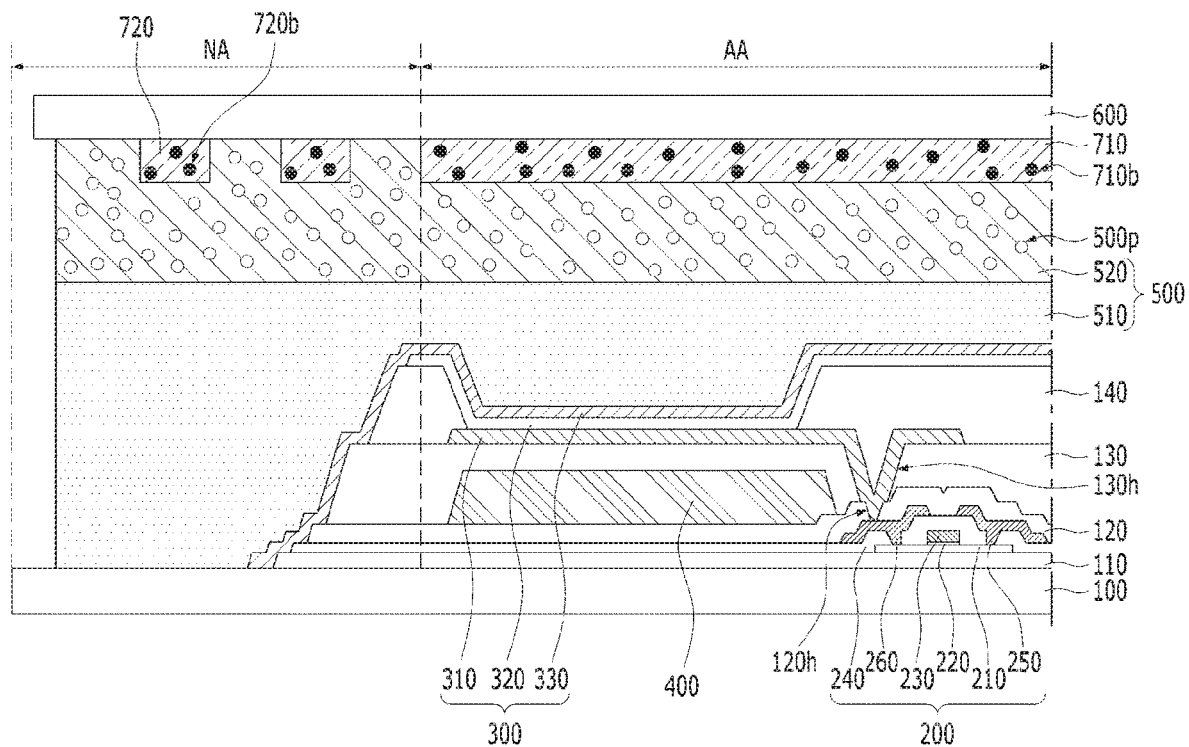

The organic light-emitting display device according to another embodiment of the present disclosure may include a first reinforcing member 710 overlapping with the display area AA of the device substrate 100, and a second reinforcing member 720 overlapping with the non-display area NA of the device substrate 100, as shown in FIG. 4. The first reinforcing member 710 and the second reinforcing member 720 may be disposed between the encapsulating layer 500 and the encapsulating substrate 600. The first reinforcing member 710 may include first metal beads 710b. The second reinforcing member 720 may include second metal beads 720b. The second metal beads 720b may include a magnetic material. For example, the second metal beads 720b may include a ferromagnetic metal, such as iron (Fe), nickel (Ni) and cobalt (Co). In one embodiment, the second metal beads 720b are ferrous metals not yet magnetized and have no magnetic field. In another embodiment, the second metal beads 720b are magnetized prior to being inserted into the layer and thus have a magnetic field while encapsulated. For example, the second metal beads 720b may include a material same as the first metal beads 710b. Thus, in the organic light-emitting display device according to another embodiment of the present disclosure, the damage of the light-emitting element 300 due to the external impact may be prevented, efficiently.

Figure 5:
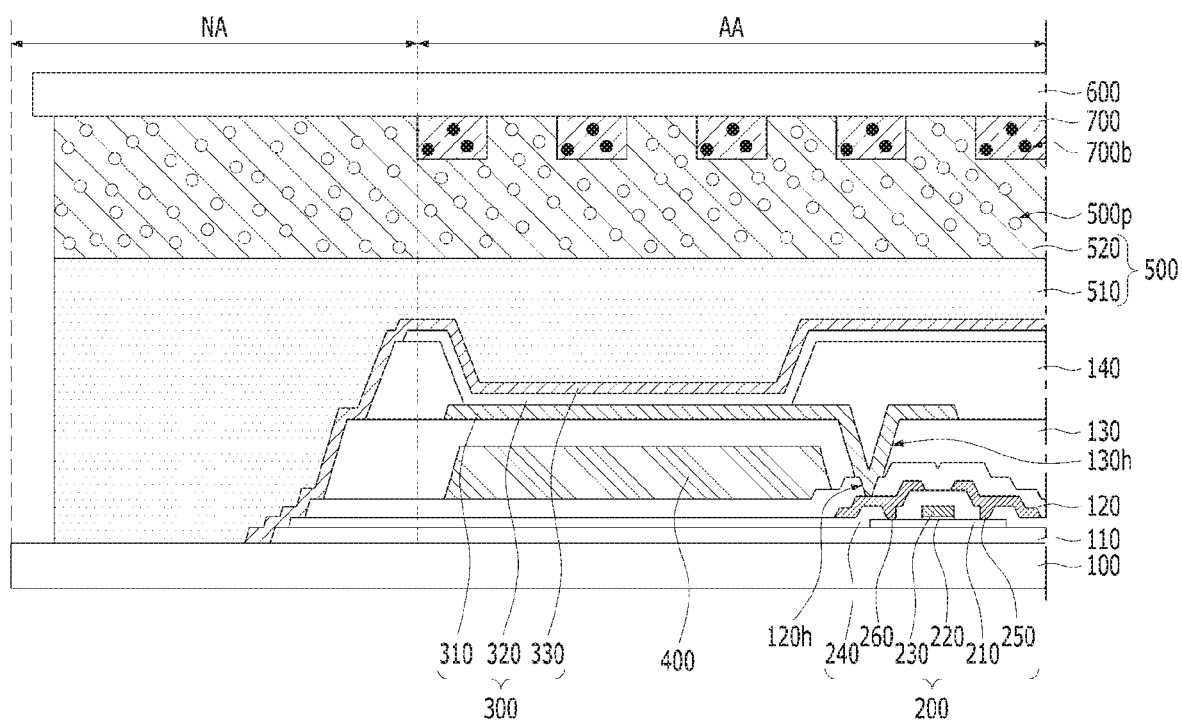

The second reinforcing member 720 may be spaced away from the first reinforcing member 710. For example, a side surface of the first reinforcing member 710 and a side surface of the second reinforcing member 720 may be covered by the encapsulating layer 500. Thus, in the organic light-emitting display device according to another embodiment of the present disclosure, the permeation of the external moisture through the first reinforcing member 710 and the second reinforcing member 720 may be blocked, efficiently. The second reinforcing member 720 may include a plurality members laid out in a selected pattern, with the various members 720 being spaced away from each other. The organic light-emitting display device according to one embodiment of the present disclosure is described that the reinforcing member 700 is a plate shape. However, in the organic light-emitting display device according to another embodiment of the present disclosure, the reinforcing member 700 on the light-emitting element 300 may be composed of a plurality of patterns which are spaced away from each other, as shown in FIG. 5. For example, the organic light-emitting display device according to another embodiment of the present disclosure may include the reinforcing member 700 having a mesh shape. Thus, in the organic light-emitting display device according to another embodiment of the present disclosure, the damage of the light-emitting element 300 due to the external impact may be prevented, and the permeation of the external moisture through the reinforcing member 700 may be blocked, efficiently.

In the result, the organic light-emitting display device according to the embodiments of the present disclosure may include the reinforcing member overlapping with the light-emitting element between the encapsulating layer and the encapsulating substrate. Thus, in the organic light-emitting display device according to the embodiments of the present disclosure, the damage of the light-emitting element due to the external impact may be prevented without increasing the overall thickness. Also, in the organic light-emitting display device according to the embodiments of the present disclosure, the side surface of the reinforcing member may be surrounded by the encapsulating layer. Therefore, in the organic light-emitting display device according to the embodiments of the present disclosure, the permeation of the external moisture through the reinforcing member may be blocked. Thereby, in the organic light-emitting display device according to the embodiments of the present disclosure, the heat radiation efficiency and the reliability may be increased.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light-emitting display device comprising:
a device substrate including a display area and a non-display area;
a light-emitting element on the display area of the substrate;
an encapsulation layer overlying the light-emitting element, the encapsulation layer being in the display area;
a bead holding encapsulation layer overlying a portion of the encapsulation layer, the bead holding encapsulation layer overlapping with the display area of the substrate;
a plurality of metal beads within the bead holding encapsulation layer; and
an encapsulating substrate overlying the bead holding encapsulation layer,
wherein the metal beads within the bead holding encapsulation layer are comprised of a ferrous metal.

2. The organic light-emitting display device of claim 1 wherein the ferrous metal beads within the bead holding encapsulation layer are configured to be magnetically coupled to a jig for moving the device substrate during the manufacturing process.

3. The organic light-emitting display device of claim 1 wherein the bead holding encapsulation layer is laid out in pattern having a plurality of members, each of the members being spaced from each other at selected locations.

4. The organic light-emitting display device of claim 1 wherein the bead holding encapsulation layer further includes moisture-absorbing beads.

5. The organic light-emitting display device of claim 1 wherein the bead holding encapsulation layer further includes elastic beads, wherein the elastic beads include rubber or a polymer material.

6. The organic light-emitting display device of claim 1 further including a second bead holding encapsulation layer in the non-display area of the substrate.

7. The organic light-emitting display device of claim 6 wherein the second bead holding encapsulation layer includes a plurality of portions positioned in the non-display area, each of the portions being spaced from each other.

8. An organic light-emitting display device comprising:
a device substrate including a display area and a non-display area;
a light-emitting element on the display area of the substrate;
an encapsulation layer overlying the light-emitting element, the encapsulation layer being in the display area;
a plurality of moisture absorbing beads positioned within the encapsulation layer;
a bead holding encapsulation layer overlying a portion of the encapsulation layer, the bead holding encapsulation layer overlapping with the display area of the substrate;
an encapsulating substrate overlying the bead holding encapsulation layer and the encapsulation layer; and
metal beads within the bead holding encapsulation layer, wherein the metal beads within the bead holding encapsulation layer are comprised of a ferrous metal.

9. The organic light emitting display device of claim 8 further including:
a plurality of members of the bead holding encapsulation layer being positioned in the non-display area, each of the members being spaced from each other.

10. An organic light-emitting display device comprising:
a device substrate including a display area and a non-display area disposed outside the display area;
a light-emitting element on the display area of the device substrate;
an encapsulating layer on the light-emitting element, the encapsulating layer being in the display area and also in the non-display area of the device substrate;
an encapsulating substrate on the encapsulating layer;
a first reinforcing member between the encapsulating layer and the encapsulating substrate, the first reinforcing member overlapping with the display area of the device substrate; and
first metal beads within the first reinforcing member, wherein the first metal beads within the first reinforcing member are comprised of a ferrous metal.

11. The organic light-emitting display device according to claim 10, wherein the encapsulating layer covers a side surface of the first reinforcing member.

12. The organic light-emitting display device according to claim 10, further comprising a second reinforcing member between the encapsulating layer and the encapsulating substrate, the second reinforcing member overlapping the non-display area of the device substrate and being the second reinforcing member is spaced away from the first reinforced member.

13. The organic light-emitting display device according to claim 12, wherein a side surface of the second reinforcing member is covered by the encapsulating layer.

14. The organic light-emitting display device according to claim 12, wherein the second reinforcing member includes a plurality of portions being spaced away from each other.

15. The organic light-emitting display device according to claim 10, wherein the first reinforcing member includes a material that is the same as the encapsulating layer, and
wherein the first reinforcing member is harder than the encapsulating layer.

16. The organic light-emitting display device according to claim 10, further including:
a plurality of moisture-absorbing beads within the first reinforcing member.

17. The organic light-emitting display device according to claim 16, further including moisture-absorbing particles within the encapsulating layer, and
wherein the density of the moisture-absorbing beads in the first reinforced member is lower than the density of the moisture-absorbing particles in the encapsulating layer.

18. An organic light-emitting display device comprising:
an encapsulating substrate on a device substrate;
a light-emitting element on an upper surface of the device substrate facing the encapsulating substrate;
a reinforcing member on a lower surface of the encapsulating substrate facing the device substrate;
an encapsulating layer between the device substrate and the encapsulating substrate, the encapsulating layer surrounding the light-emitting element and the reinforcing member, and
a plurality of metal beads within the reinforcing member, wherein the metal beads within the reinforcing member are comprised of a ferrous metal.

19. The organic light-emitting display device according to claim 18, further including aluminum within the encapsulating substrate.

20. The organic light-emitting display device according to claim 15, wherein the first reinforcing member includes an olefin-based material.

21. The organic light-emitting display device according to claim 12, further comprising second metal beads within the second reinforcing member, wherein the second metal beads within the second reinforcing member are comprised of a ferrous metal.

22. The organic light-emitting display device according to claim 21, wherein the second metal beads include the same material as the first metal beads.

* * * * *